United States Patent
Nagai et al.

(10) Patent No.: US 6,815,677 B2
(45) Date of Patent: Nov. 9, 2004

(54) SCANNING ELECTRON MICROSCOPE AND METHOD OF CONTROLLING THE SAME

(75) Inventors: Kouichi Nagai, Kawasaki (JP); Takahiro Ikeda, Yokohama (JP)

(73) Assignees: Fujitsu Limited, Kawasaki (JP); Kabushiki Kaisha Toshiba, Kawasaki (JP)

(*) Notice: Subject to any disclaimer, the term of this patent is extended or adjusted under 35 U.S.C. 154(b) by 298 days.

(21) Appl. No.: 09/815,282

(22) Filed: Mar. 23, 2001

(65) Prior Publication Data

US 2001/0035495 A1 Nov. 1, 2001

(30) Foreign Application Priority Data

Mar. 24, 2000 (JP) ........................................ 2000-085325

(51) Int. Cl.[7] ............................ G21K 7/00; G01N 23/00
(52) U.S. Cl. ........................ 250/310; 250/306; 250/307; 250/311
(58) Field of Search ................................. 250/306, 307, 250/310, 311

(56) References Cited

U.S. PATENT DOCUMENTS 5,276,325 A * 1/1994 Todokoro et al. ........... 250/310
5,412,209 A * 5/1995 Otaka et al. ................. 250/310
6,476,388 B1 * 11/2002 Nakagaki et al. ........... 250/310

FOREIGN PATENT DOCUMENTS

JP      10-213427      8/1998

* cited by examiner

*Primary Examiner*—John R. Lee
*Assistant Examiner*—Paul M. Gurzo
(74) *Attorney, Agent, or Firm*—Armstrong, Kratz, Quintos, Hanson & Brooks, LLP

(57) ABSTRACT

The present invention provides a scanning electron microscope that can obtain a high-precision SEM image and width measurement values, without damaging an object to be measured even at a high magnification. This scanning electron microscope irradiates a sample with an electron beam so as to detect secondary electrons released from the sample due to the irradiation. The scanning electron microscope also includes scan generators for detecting the secondary electrons at a frequency depending on a detection magnification for the sample. The present invention also provides a method of measuring a pattern size using the above scanning electron microscope.

25 Claims, 14 Drawing Sheets

CUT-OFF REGION | IMAGE INFORMATION REGION | CUT-OFF REGION

CUT-OFF REGION | IMAGE INFORMATION REGION | CUT-OFF REGION

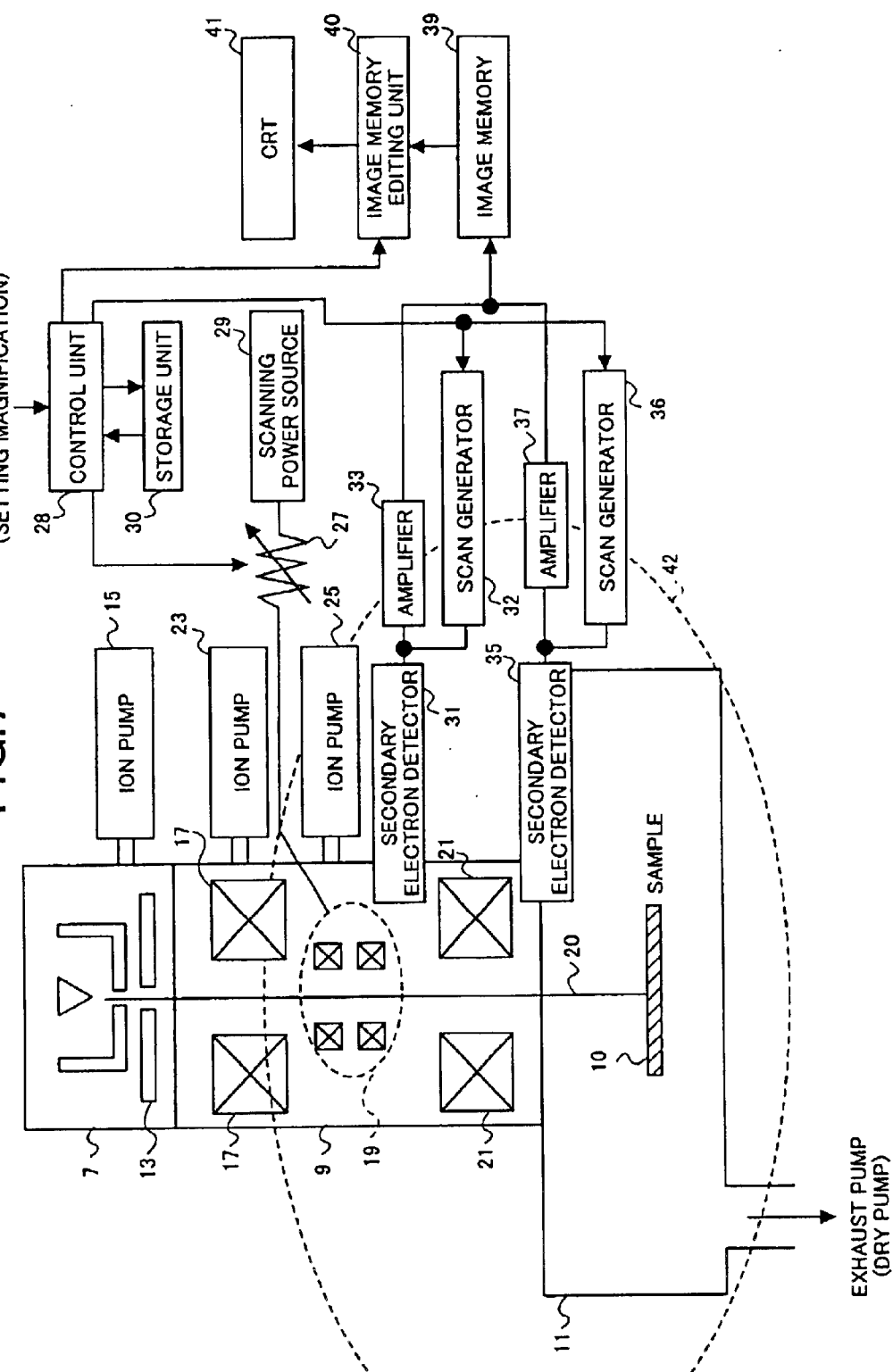

SCANNING ELECTRON MICROSCOPE AND METHOD OF CONTROLLING THE SAME

BACKGROUND OF THE INVENTION

1. Field of the Invention

The present invention generally relates to a scanning electron microscope (SEM) device, and, more particularly, to a critical dimension scanning electron microscope (CD-SEM) device and a method of measuring a pattern size obtained by the CD-SEM device.

2. Description of the Related Art

For today's ultra-fine semiconductor devices, a design rule of 0.1 μm or smaller is being used. To produce such ultra-fine semiconductor devices, it is necessary to form a pattern having a line width of 0.1 μm or smaller.

By a conventional method of measuring a pattern width by a CD-SEM, an electron scanning region (or a field of view) is scanned with electrons, and secondary electrons released from the sample to be measured are subjected to brightness conversion by the scintillator. The converted amount of the secondary electrons is displayed. In a CD-SEM, the brightness level is used for obtaining image data and line-width data.

FIG. 1 is a flowchart showing a conventional method of changing the magnification and measuring the pattern size by a CD-SEM, and FIGS. 2A to 2C illustrate the method shown in FIG. 1.

As shown in FIG. 1, a magnification of 50K (K is $10^3$) is selected in step S1. Here, the scanning range of an electron beam is indicated by a region 1 shown in FIG. 2A. This region 1 includes a pitch line pattern 2 formed on a device chip (a sample). In step S2, the scanning range is irradiated with the electron beam. In step S3, secondary electrons released from the sample are sent to a scintillator.

In step S4, based on a signal generated by brightness conversion performed by the scintillator, an image that reproduces the region 1 obtained by the CD-SEM device at the 50K magnification is outputted to a CRT. In step S5, the line width (the measured value) of the pitch line pattern 2 measured by the CD-SEM device at the 50K magnification is outputted to the CRT.

If desired information cannot be obtained from the image outputted to the CRT in step S4, the magnification is increased. For instance, a magnification of 100K is selected in step S6. As shown in FIGS. 2A and 2B, the electron beam scanning range is indicated by a region 3. In step S7, the scanning range constituted by the region 3 is irradiated with an electron beam. In step S8, secondary electrons released from the pitch line pattern 2 are captured by the scintillator.

In step S9, based on a signal generated by brightness conversion performed by the scintillator, an image that reproduces the region 3 obtained by the CD-SEM device at the 100K magnification is outputted to a CRT. In step S10, the line width (the measured value) of the pitch line pattern 2 measured by the CD-SEM device at the 100K magnification is outputted to the CRT.

If desired information is not obtained from the image outputted to the CRT in step S9, the magnification is further increased. For instance, a magnification of 150K is selected in step S11. As shown in FIGS. 2B and 2C, the electron beam scanning range is indicated by a region 5. In step S12, the scanning range constituted by the region 5 is irradiated with an electron beam. In step S13, secondary electrons released from the pitch line pattern 2 are supplied to the scintillator. In step S14, based on a signal generated by brightness conversion performed by the scintillator, an image that reproduces the region 5 obtained by the CD-SEM device at the 150K magnification is outputted to the CRT. In step S15, the line width (the measured value) of the pitch line pattern 2 measured by the CD-SEM device at the 150K magnification is outputted, and the operation then comes to an end.

In the above operation, the timing of the scintillator capturing the secondary electrons forms uniform intervals. For instance, the capturing intervals may be $10^{-7}$ (sec). With the electron irradiation amount per unit area in the region 1 at the 50K magnification shown in FIG. 2A being normalized to 1.0, the electron irradiation amount per unit area in the region 3 at the 100K magnification shown in FIG. 2B is 4.0, and the electron irradiation amount per unit area in the region 5 at the 150K magnification shown in FIG. 2C is 9.0.

As described above, as semiconductor chips have rapidly become smaller, there is an increasing need to produce a CD-SEM having a high magnification so as to measure the line widths of an ultra-fine pattern. With a higher magnification, a resolution per pixel becomes higher, and a high-precision SEM image and pattern measurement can be carried out.

However, the above method causes problems that hinder high-precision measurement of pattern widths. More specifically, to increase a measuring magnification, the area of an electron beam irradiation region or a field of view (FOV) is reduced. If the FOV is small while the magnification is high, the quantity of electron irradiation per unit area on the surface of the sample increases, and a large amount of electrons is applied to a small area. As a result, the influence from charges and contamination becomes greater at a high magnification. For instance, there will be problems that the contrast varies to make the object (a measured pattern) look darker, and that the line widths in a reproduced image are different from the original.

The influence from charging can be eliminated by reducing the current density at a high modification. With a reduced current density, however, there will be other problems, such as focus deviation of a scanning electron beam and a decrease in S/N ratio of an obtained brightness signal. As for the contamination, a material such as amorphous carbon in the chamber is polymerized with incident grains, and accumulates on the sample. To reduce the adverse influence from the contamination, the vacuum degree in the chamber is increased, and a technique, such as a cold trap technique, for collecting amorphous carbon, has been employed, but no sufficient results have been reported to this date.

As described so far, with the conventional techniques, it is difficult to obtain high-precision SEM images and to perform accurate line width measurement, because of the strong influence from the charging and contamination at a high magnification.

Japanese Laid-Open Patent Application No. 10-213427 discloses a method of measuring a size of a circuit pattern for a short period of time by reducing damage and charges applied on the circuit pattern on the wafer. However, this method is utilized for scanning a smallest possible area for measuring the edges of a circuit pattern. As the magnification becomes higher, the quantity of electron irradiation per unit area becomes larger. As a result, the problem of deterioration in measurement accuracy remains. Also, the entire area is subjected to electron irradiation so as to determine a scanning range, resulting in contamination (or carbonization) on the scanned area.

SUMMARY OF THE INVENTION

A general object of the present invention is to provide scanning electron microscopes in which the above disadvantages are eliminated.

A more specific object of the present invention is to provide a scanning electron microscope that can constantly obtain a high-precision SEM image and a pattern width measurement value, without damaging an object to be measured even at a high magnification, and a method of measuring a pattern size using the scanning electron microscope.

The above objects of the present invention are achieved by a method of controlling a scanning electron microscope, the method comprising the steps of: irradiating an object with an electron beam; and detecting electrons generated from the object due to the irradiation, at a frequency depending on a magnification for observing the object.

By this method, a desired image can be obtained regardless of the detection magnification.

The above objects of the present invention are also achieved by a method of controlling a scanning electron microscope, the method comprising the steps of:

irradiating a surface of a sample object with an electron beam; and detecting electrons released from the surface of the sample object due to the irradiation, wherein:

a first scanning range in a first direction of two different directions on the surface of the sample object is selected in accordance with a detection magnification on the surface of the sample object, while a second scanning range in a second direction of the two different directions is fixed; and the electron detection is performed at intervals T=(FOV1/FOV2)×t1, with the first scanning range being FOV1, the second scanning range being FOV2, and an initial value of the intervals being t1.

By this method, a desired image can be obtained regardless of the detection magnification.

The above objects of the present invention are also achieved by a scanning electron microscope including:

an irradiating unit that irradiates an object with an electron beam; and a detecting unit that detects electrons released from the object due to the irradiation, at a frequency depending on a magnification at which the object is observed.

The above objects of the present invention are also achieved by a scanning electron microscope that irradiates a surface of a sample object with an electron beam so as to detect electrons released from the surface of the sample object due to the irradiation, said microscope comprising:

a scanning unit that determines a first scanning rage in a first direction of two different directions on the surface of the sample object in accordance with a detection magnification for the surface of the sample object, while maintaining a second scanning range in a second direction of the two different directions constant; and a detection timing determining unit that determines intervals T for detecting electrons by (FOV1/FOV2)×t1, the first scanning range being FOV1, the second scanning range being FOV2, and an initial value of detection intervals being t1.

With the above scanning electron microscope, the magnification can be increased without increasing the quantity of electron beam per unit area on an object to be measured. Accordingly, the object to be measured can be prevented from being affected by adverse influence from charging and contamination, and all the problems that might be caused by the adverse influence can be avoided. Furthermore, since the object to be measured is protected from damage, a high-precision image and a pattern size measured value can be constantly obtained.

The above and other objects and features of the present invention will become more apparent from the following description taken in conjunction with the accompanying drawings.

BRIEF DESCRIPTION OF THE DRAWINGS

FIG. 7 shows the entire structure of a CD-SEM in accordance with a second embodiment of the present invention;

DESCRIPTION OF THE PREFERRED EMBODIMENTS

Figure 1:
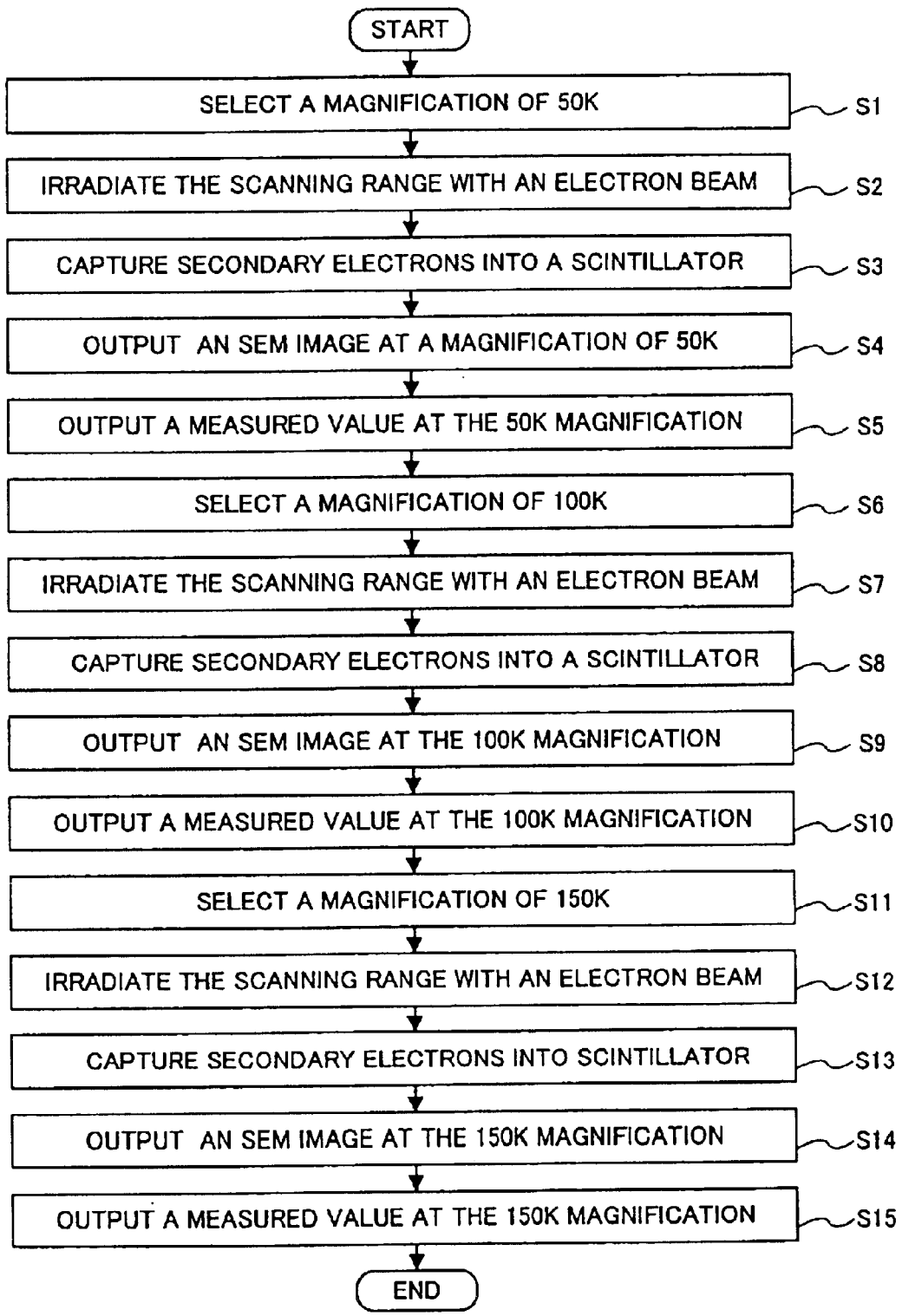
FIG. 1 is a flowchart of a magnification changing method and a pattern-size measuring method performed by a conventional scanning electron microscope (SEM)
Figure 2A:
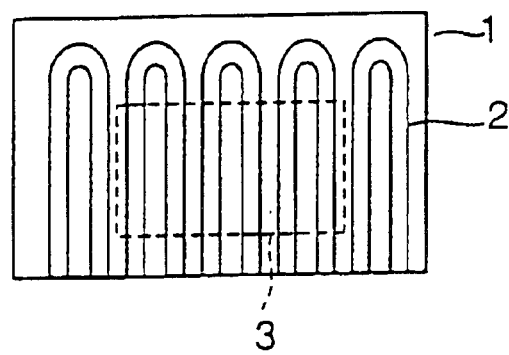
FIGS. 2A to 2C illustrate the magnification changing method and the pattern-size measuring method shown in FIG. 1.
Figure 2B:
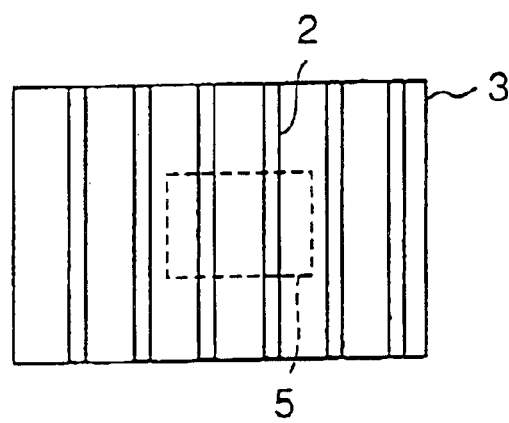
Figure 2C:
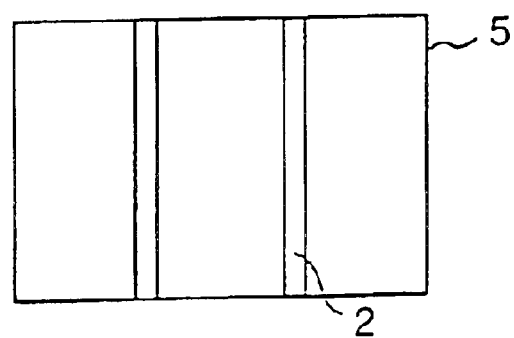

The following is a description of embodiments of the present invention, with reference to the accompanying drawings. In the drawings, like components are indicated by like reference numerals.

In this embodiment, the intensity of electron irradiation per unit area on a sample to be measured is not increased with a higher magnification and a narrower scanning range in a scanning electron microscope. More specifically, the scanning technique, the electron capturing range, and the capturing timing are controlled in the manner described below.

As the magnification of a scanning electron microscope becomes higher, the electron scanning rate for scanning the surface of the sample to be measured becomes lower. In other words, the scanning rate becomes lower with a higher magnification on a sample, even when the actual electron scanning rate is kept constant. To solve this problem, the scanning rate can be increased with an increase in magnification. However, being normally set at the highest possible scanning rate, the electron scanning rate cannot be changed. In view of this, this embodiment provides a method of limiting the capturing timing and the capturing range of the scintillator without changing the scanning range of one direction at a high magnification.

In the following, the present invention is applied to a critical dimension scanning electron microscope (CD-SEM). However, it should be understood that the present invention may be applied to other devices involving converging charged particle beams.

First Embodiment

Figure 3:
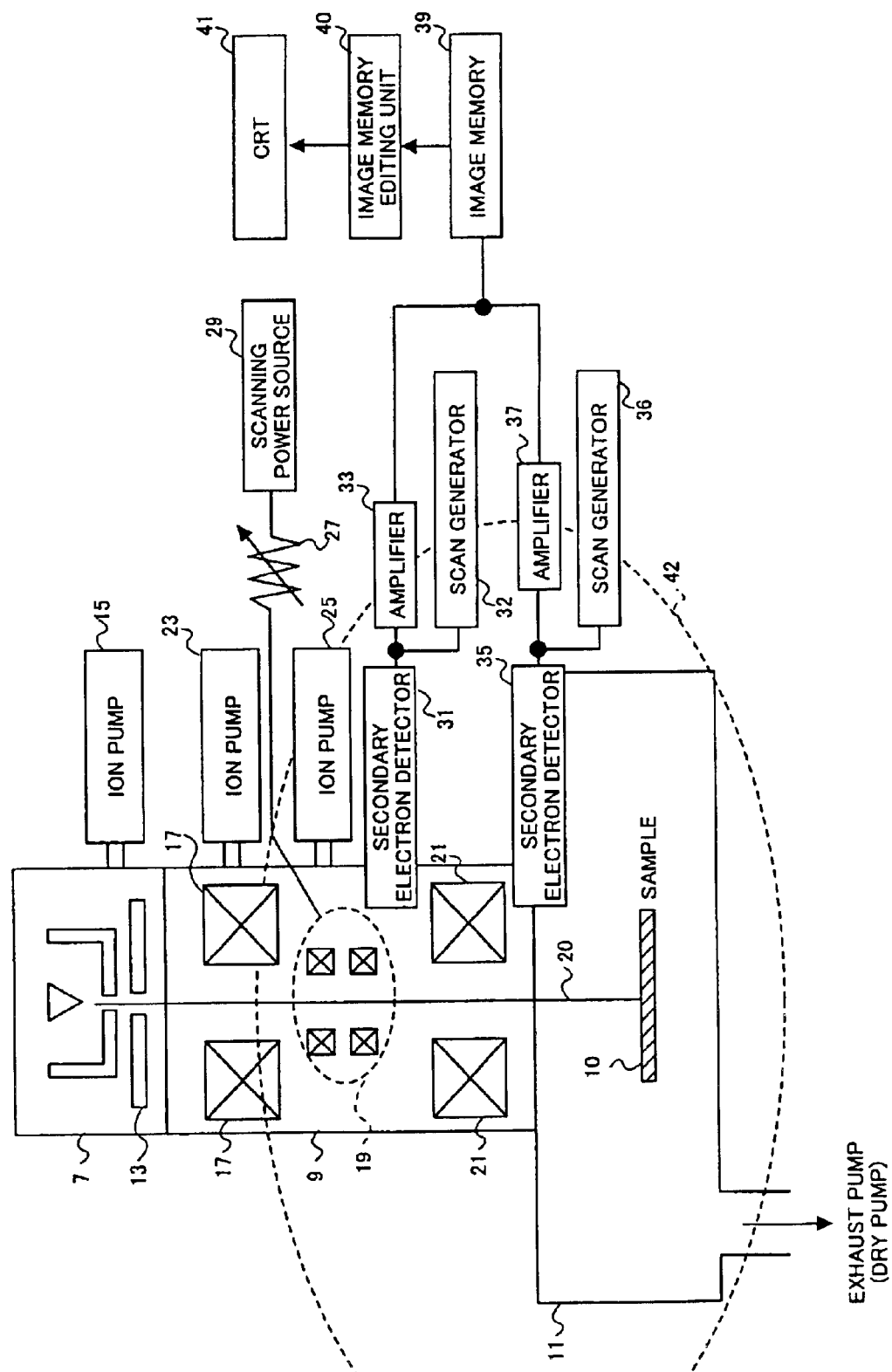
FIG. 3 shows the entire structure of a CD-SEM in accordance with a first embodiment of the present invention.

FIG. 3 shows the structure of a CD-SEM in accordance with a first embodiment of the present invention. As shown in FIG. 3, this CD-SEM comprises an electron gun 7, a column 9, a sample chamber 11 in which a sample 10 is placed, ion pumps 15, 23, and 25, a magnification variable resistance 27, a scanning power source 29, secondary electron detectors 31 and 35, scan generators 32 and 36, amplifiers 33 and 37, an image memory 39, an image memory editing unit 40, and a CRT 41. The electron gun 7 includes an anode 13. The column 9 contains capacitor lenses 17, deflecting coils 19, and object lenses 21. The sample chamber 11 is exhausted by an exhaust pump (a dry pump).

Figure 4:
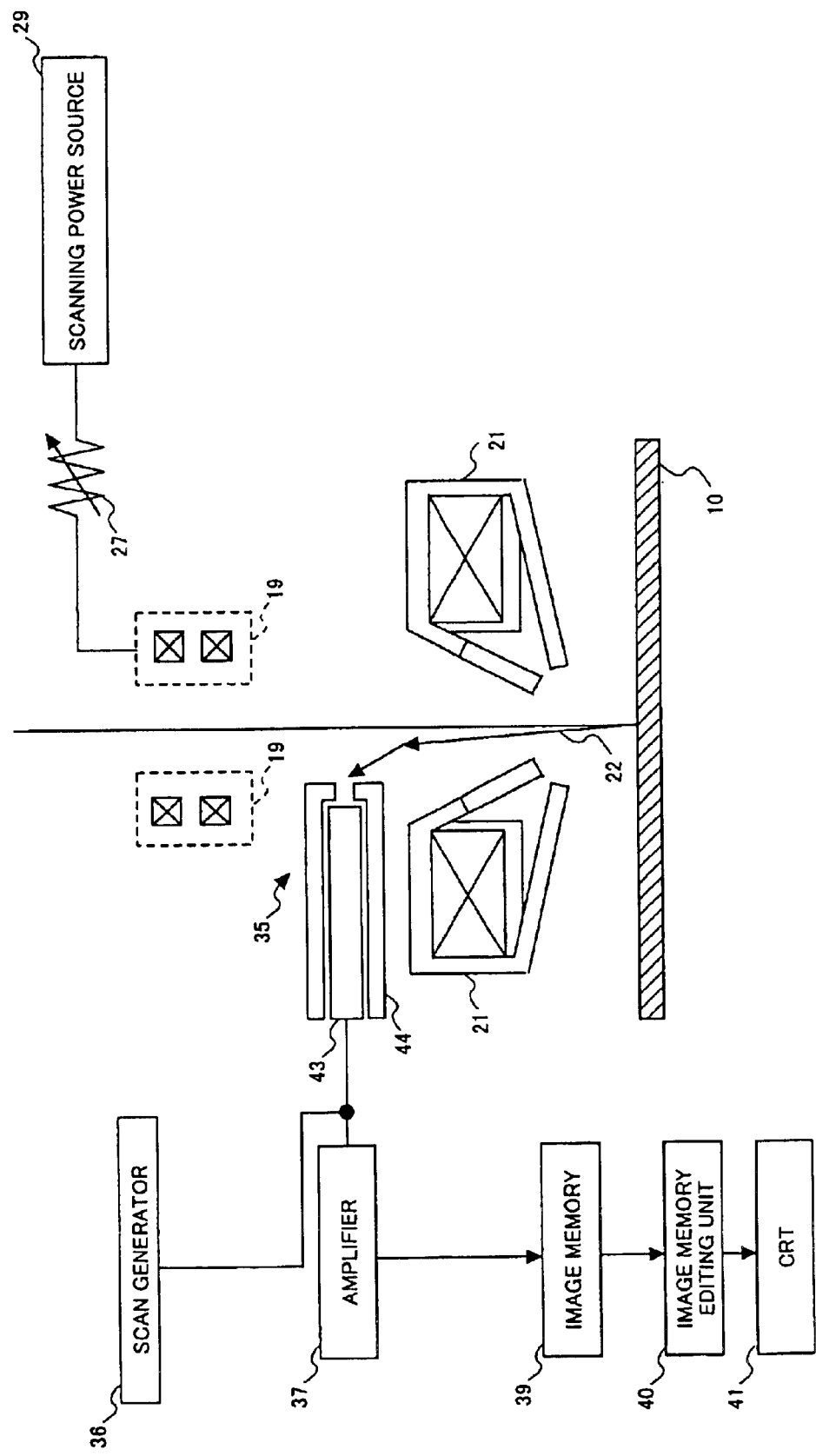
FIG. 4 is an enlarged view of a main unit shown in FIG. 3.

FIG. 4 is an enlarged view of a main unit 42 shown in FIG. 3. Here, the number of deflecting coils 19 contained in the column 9 varies with the device, and the deflecting coils 19 may be replaced by electrodes.

As shown in FIGS. 3 and 4, the secondary electron detector 31 is connected to the amplifier 33 and the scan generator 32. Meanwhile, the secondary electron detector 35 is connected to the amplifier 37 and the scan generator 36. The amplifiers 33 and 37 are connected to the image memory 39, which is connected to the image memory editing unit 40. The CRT 41 is connected to the image memory editing unit 40. The scanning power source 29 is connected to the deflecting coils 19 via the magnification variable resistance 27.

In the CD-SEM having the above structure, primary electrons 20 emitted from the electron gun 7 are deflected at a desired magnification by the deflecting coils 19. The deflected primary electrons 20 then collide with the sample 10 to release secondary electrons 22. The secondary electrons 22 go up in the impinging direction of the primary electrons 20, i.e., move upward from the sample 10 to be detected by the secondary electron detectors 31 and 35. A scintillator 44 contained in the secondary electron detectors 31 and 35 generates a signal that is proportional to the number of detected electrons. The generated signal is then amplified by the amplifiers 33 and 37 to generate an image signal.

The image signal is stored in the image memory 39, and edited by the image memory editing unit 40. The resultant image is displayed on the CRT 41.

The timing of the scintillator 21 capturing the secondary electrons 22 generated from the sample 10 is controlled by the scan generators 32 and 36, so that the secondary electrons 22 are captured at a predetermined timing. The magnitude of the current flowing through scanning coils that constitute the deflecting coils 19 is adjusted so as to make the magnification variable. In other words, the deflecting direction of the primary electrons 20 can be changed by varying the magnitude of the current flowing through the scanning coils. Generally, a deflector for deflecting the primary electrons 20 can be an electromagnetic deflector or an electrostatic deflector. In this embodiment, the electromagnetic deflector is employed. In the electrostatic deflector, the balance of a voltage applied to the electrodes is varied so as to obtain a magnification deflection and a longitudinal and transverse deflection having different magnifications between the vertical direction and the horizontal direction.

Figure 5:
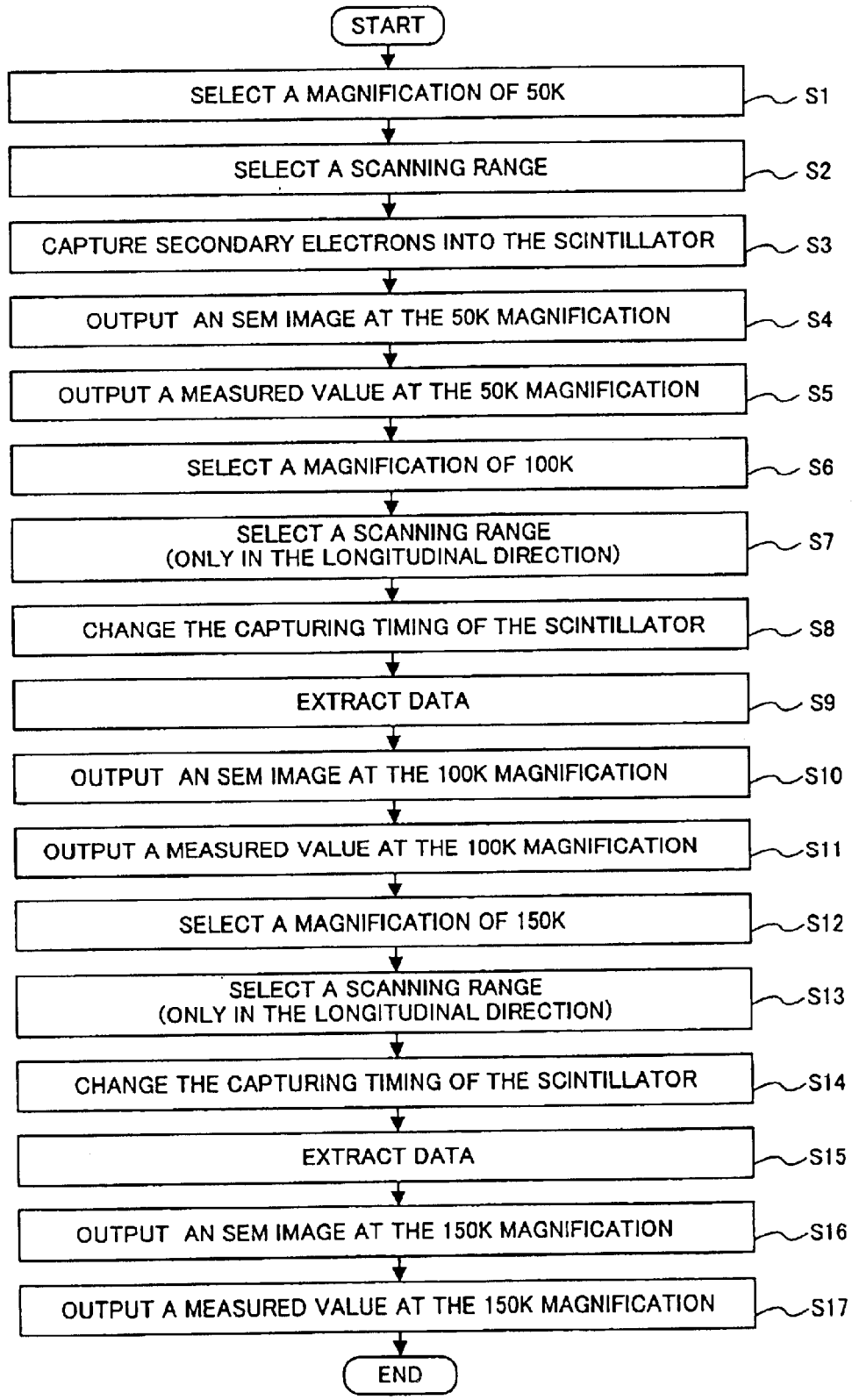
FIG. 5 is a flowchart showing a magnification changing method and a pattern-size measuring method performed by the CD-SEM of the first embodiment of the present invention.
Figure 6A:
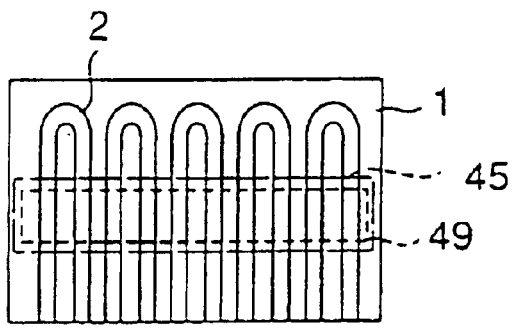
FIGS. 6A to 6C illustrate the magnification changing method and the pattern-size measuring method shown in FIG. 5.
Figure 6B:
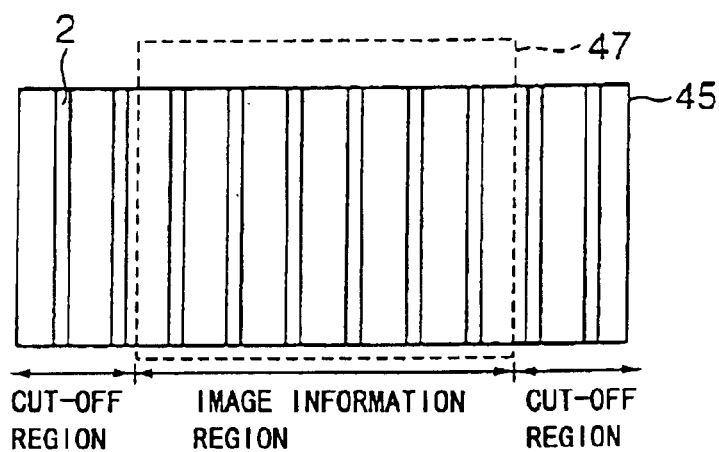
Figure 6C:
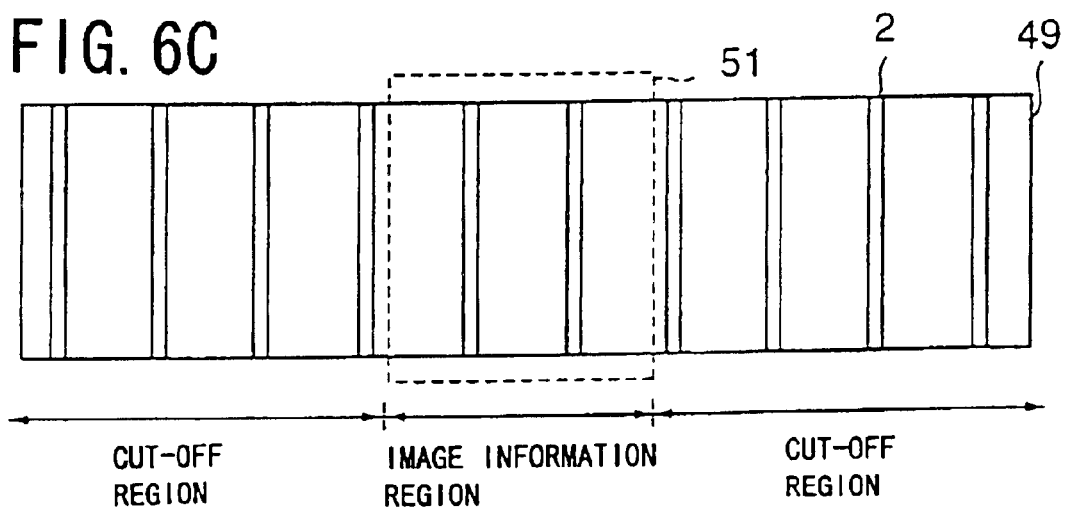

In the following, a case in which a threshold magnification for changing scanning ranges is 50K will be described. FIG. 5 is a flowchart showing a magnification changing method and a pattern-size measuring method performed by the CD-SEM of the first embodiment of the present invention. FIGS. 6A to 6C illustrate the methods shown in FIG. 5.

As shown in FIG. 5, a magnification of 50K, for instance, is selected in step S1. Since the selected magnification of 50K is smaller than the threshold magnification, a region 1 shown in FIG. 6A is selected as a scanning range of an electron beam in step S2. This region 1 contains a pitch line pattern 2 formed on a device chip (the sample 10).

In step S3, the scanning range is irradiated with an electron beam, and secondary electrons released from the sample are captured by the scintillator. In step S4, based on a signal generated by brightness conversion performed by the scintillator, an image that reproduces the region 1 obtained by the CD-SEM at the 50K magnification is outputted to the CRT 41. In step S5, the line width (a measured value) of the pitch line pattern 2 measured by the CD-SEM at the 50K magnification is outputted to the CRT 41.

If desired information is not obtained from the image outputted to the CRT 41 in step S4, the magnification is increased. In step S6, a magnification of 100K, for instance, is selected. Since the selected magnification of 100K is higher than the threshold magnification of 50K, a region 45 that has the same length as the region 1 in the horizontal direction but has a shorter length than the region 1 in the vertical direction is selected as the scanning range, as shown in FIGS. 6A and 6B. In order to change the scanning direction only in one direction (the vertical direction) as described above, the ratio of currents flowing through the deflecting coils 19 in both directions should be varied, and the magnetic field of the electromagnetic lens should be balanced. The fixed axis in the electron beam scanning may extend either in the vertical direction or in the horizontal direction.

In step S8, the scanning range constituted by the region 45 is irradiated with an electron beam. As a result, the timing of the scintillator capturing the secondary electrons generated from the sample is changed as follows. More specifically, with the variable scanning range being FOV1 and the fixed scanning range being FOV2, and the initial value of the capturing timing of the scintillator being t1, the capturing intervals T of the scintillator can be expressed by the following equation (1).

$$T = (FOV1/FOV2) \times (t1) \tag{1}$$

Here, FOV1 is set to be 1.5 µm in accordance with the vertical length of the region 45 enlarged at a magnification of 100K, while FOV2 is set to be 3.0 μm in accordance with the vertical length of the region 1 enlarged at the magnification of 50K. As t1 is (sec), the capturing timing T of the scintillator becomes (½)×⅟8388608 (sec).

Since it is apparent from the equation (1) that FOV1 becomes smaller with a higher magnification, the capturing timing T becomes small, and the electron detecting frequency becomes high.

As the scan generators 32 and 36 determine the capturing timing, i.e., the secondary electron detecting timing, it is possible to change the capturing timing by setting the above-mentioned time for the scan generators 32 and 36. The secondary electrons 22 captured into the scintillator 44 are then subjected to brightness conversion to generate signals depending on the brightness level.

As the capturing intervals become shorter, the number of obtained signals becomes larger. Accordingly, when the information based on the signals is outputted, the resultant image is too long in the horizontal direction, as shown in FIG. 6B. Therefore, in step S9, unnecessary information is cut off by the image memory editing unit 40, and the remaining data is extracted. In the above example, the resultant image has a length twice as great as the scanning range 45 in the horizontal direction. Accordingly, half of the information is discarded. As shown in FIG. 6B, the information obtained between the scan start point and the one-fourth point in the horizontal direction, and between the three-fourths point and the scan end point in the horizontal direction, is cut off. The remaining data obtained in an image information region 47 that is located between the one-fourth point and the three-fourths point is extracted. In this embodiment, when the magnification is 100K, secondary electrons are detected at a frequency twice as high as in the case of the magnification of 50K, and half of the data is extracted as image data.

In step S10, an image that reproduces the region 47 obtained by the CD-SEM at the 100K magnification is outputted onto the CRT 41. In step S11, line widths (measured values) of the line pitch pattern 2 measured by the CD-SEM at the 100K magnification are outputted to the CRT 41.

If desired information cannot be found in the image outputted onto the CRT 41 in step S10, the magnification is increased. For instance, a magnification of 150K is selected in step S12. In step S13, a region 49 that has the same length in the horizontal direction as in the case of the 50K magnification but is reduced in the vertical direction is selected as the electron beam scanning range, as shown in FIGS. 6A and 6C. To change the scanning range only in one direction (in the vertical direction in this case), the ratio of currents flowing through the deflecting coils 19 corresponding to the respective directions should be varied, and the magnetic field of the electromagnetic lens should be balanced. The fixed axis in the electron beam scanning extends either in the vertical direction or in the horizontal direction.

In step S14, the timing of the scintillator capturing the secondary electrons generated from the sample due to the irradiation with an electron beam on the scanning range formed by the region 49 is changed in the same manner as described above. More specifically, in the equation (1), FOV1 is 1.0 μm in accordance with the magnification of 150K, FOV2 is 3.0 μm in accordance with the magnification of 50K, and t1 is ⅟8388608 (sec). Accordingly, the capturing timing T of the scintillator should be (⅓)×⅟8388608 (sec). The capturing timing can be changed by setting the capturing intervals of the scan generators 32 and 36 at the above timing.

As the capturing intervals become shorter, the quantity of obtained information becomes larger. When the obtained information is outputted, the resultant image is too long in the horizontal direction, as shown in FIG. 6C. In step S15, unnecessary information is cut off by the image memory editing unit 40, and the remaining data is extracted. In this embodiment, the scanning range in the horizontal direction is three times as great as the scanning range in the vertical direction. As a result, two thirds of the information will be discarded. More specifically, the information obtained between the scan start point and the one-third point, and between the two-thirds point and the scan end point, is cut off, and the remaining data obtained in the image information region 51, which is located between the one-third point and the two-thirds point, is extracted, as shown in FIG. 6C.

Based on the extracted signals, an image that reproduces the image information region 51 obtained by the CD-SEM at the 150K magnification is outputted onto the CRT 41 in step S16. In step S17, the lines widths (the measured values) of the line pitch pattern 2 measured by the CD-SEM at the 150K magnification are outputted to the CRT 41. The operation then comes to an end.

By the above method, with the intensity of electron irradiation per unit area in the region 1 in the case of 50K magnification shown in FIG. 6A being normalized to 1.0, the intensity of electron irradiation per unit area in the region 45 in the case of the 100K magnification shown in FIG. 6B is also 1.0, so is the intensity of electron irradiation per unit area in the region 49 in the case of the 150K magnification shown in FIG. 6C.

As described above, with the CD-SEM of the first embodiment of the present invention, the intensity of electron irradiation per unit area does not increase at a high magnification. Accordingly, the sample to be measured can be prevented from being adversely affected by charging and contamination, and the sample can be protected from damage. Thus, a high-precision SEM image and line-width measured values can be constantly obtained. Also, with the CD-SEM of this embodiment, the resolution per pixel is constant regardless of the magnification. Thus, measured values can be obtained at high accuracy, regardless of the magnification.

Since the technique of changing the timing of the scintillator 44 capturing the secondary electrons 22 without changing the scanning rate by the primary electrons 20 is employed in this embodiment, the scanning rate is substantially increased. Accordingly, adverse influence on image formation due to electron fluctuations can be avoided. Thus, the resultant image quality can be improved, and the reproduction accuracy can be increased.

Second Embodiment

FIG. 7 shows the entire structure of a CD-SEM in accordance with a second embodiment of the present invention. As shown in FIG. 7, the CD-SEM of this embodiment has substantially the same structure as the CD-SEM of the first embodiment, except that the CD-SEM of this embodiment further comprises a control unit 28 and a storage unit 30 connected to the control unit 28. The control unit 28 is connected to the magnification variable resistance 27, the scan generators 32 and 36, and the image memory editing unit 40.

Figure 8:
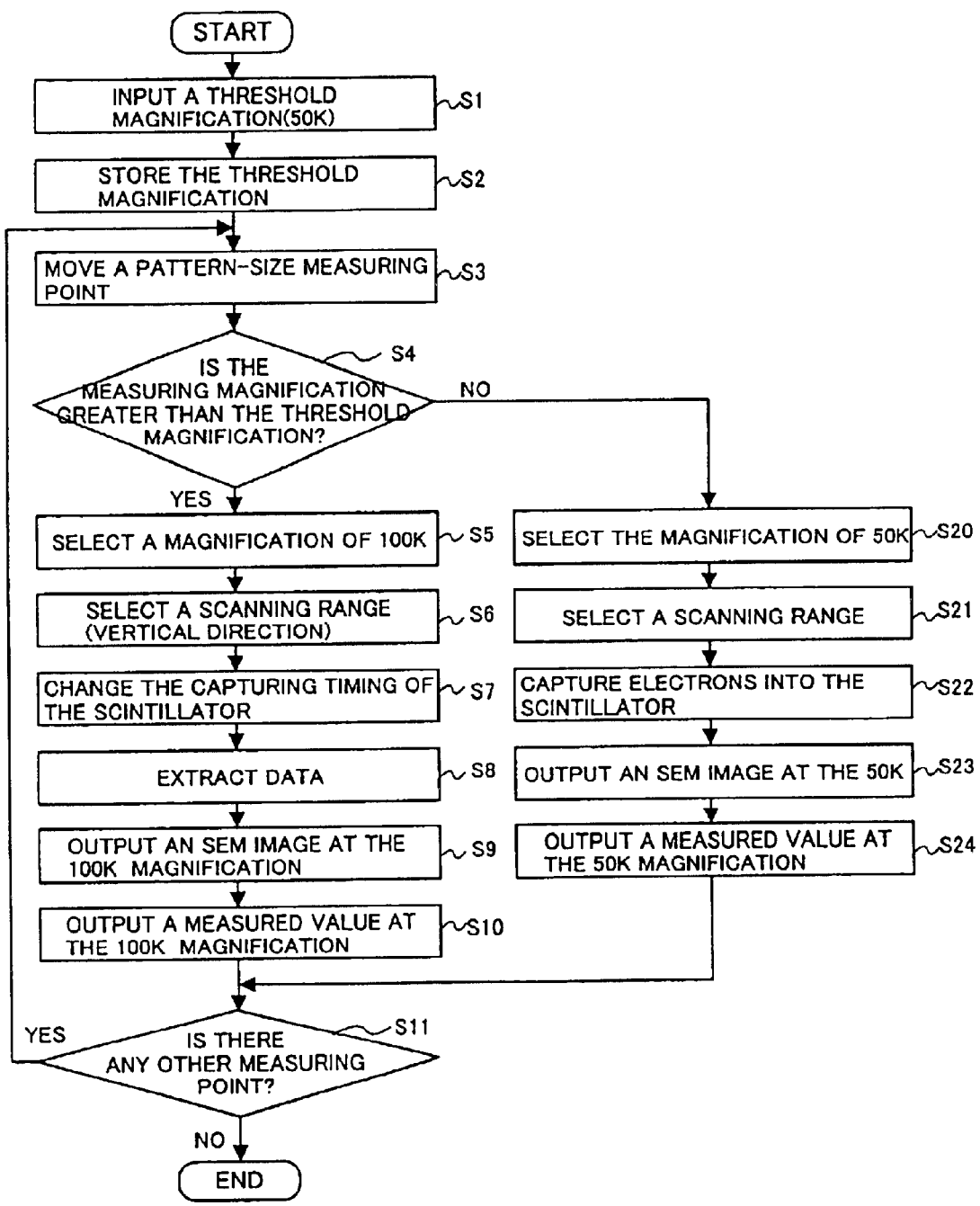
FIG. 8 is a flowchart showing an operation of the CD-SEM in accordance with the second embodiment of the present invention.

FIG. 8 is a flowchart showing an operation of the CD-SEM of the second embodiment of the present invention. As shown in FIG. 8, the CD-SEM of this embodiment operates in the same manner as the CD-SEM of the first embodiment, except that the threshold magnification, which is a threshold value for changing scanning ranges, is stored in the storage unit 30 in advance, and that the CD-SEM is controlled only when the control unit determines that a supplied measuring magnification (a setting magnification) exceeds the threshold magnification.

Referring to both FIGS. 7 and 8, the operation of the CD-SEM of this embodiment will be described. First, a threshold magnification of 50K, for instance, is inputted into the CD-SEM in step S1. In step S2, the threshold magnification is stored in the storage unit 30. In step S3, an irradiation spot of the primary electrons 20 is moved to a pattern-size measuring point. In step S4, the control unit 28 determines whether or not a set measuring magnification is higher than the threshold magnification. If the measuring magnification is higher than the threshold magnification, the operation moves on to step S5.

In step S5, a magnification of 100K is selected by the control unit 28. In step S6, a region that has the same length as the region at the 50K magnification in the horizontal direction, but has a shorter length than the region at the 50K magnification in the vertical direction is selected as the electron beam scanning range. In order to change the scanning range only in one direction (only in the vertical direction in this case), the ratio of currents flowing through the deflecting coils 19 in both directions should be varied, and the magnetic field of the electromagnetic lens should be balanced. The fixed axis in electron beam scanning may extend either in the vertical direction or in the horizontal direction.

In step S7, the timing of the scintillator capturing the secondary electrons released from the sample by the electron beam irradiation is changed. More specifically, the capturing intervals T of the scintillator are determined by the equation (1). The change of the capturing timing can be carried out by setting the capturing intervals of the scan generators 32 and 36 at the above intervals T by the control unit 28. The secondary electrons 22 captured by the scintillator 44 are then subjected to brightness conversion, thereby generating a signal in accordance with the level of brightness.

As the capturing intervals become shorter, the number of obtained signals becomes larger. Accordingly, when the information of the signals is outputted, a resultant image will be long in the horizontal direction. Therefore, excess information is cut off by the image memory editing unit 40 under the control of the control unit 28, thereby extracting data. In step S9, an image that is equivalent to the image conventionally obtained by the CD-SEM at the magnification of 100K is outputted to the CRT 41. In step S10, the line width (a pattern-size measured value) of the pitch line pattern 2 measured by the CD-SEM at the 100K magnification is outputted to the CRT 41.

Meanwhile, if the control unit 28 determines that the measuring magnification is not higher than the threshold magnification, the operation moves on to step S20. In step S20, the magnification of 50K is selected by the control unit 28. In step S21, a region that is specified as an electron beam scanning range by the initial setting is selected. In step S22, the scanning range is irradiated with an electron beam, and secondary electrons released from the sample are captured by the scintillator 44. In step S23, based on a signal generated by brightness conversion performed by the scintillator 44, an image at the 50K magnification obtained by the CD-SEM is outputted to the CRT 41. In step S24, a pattern-size measured value measured by the CD-SEM at the 50K magnification is outputted to the CRT 41.

In step S11, the control unit 28 determines whether or not other measuring points exist. If they do, the operation returns to step S3, and if there is no other measuring point, the operation comes to an end.

As described so far, with the CD-SEM of the second embodiment, the threshold magnification for changing the scanning range is stored in the storage unit 30 in advance. Accordingly, the changing of the scanning range in the CD-SEM of the present invention can be carried out at a higher speed.

Third Embodiment

Figure 9:
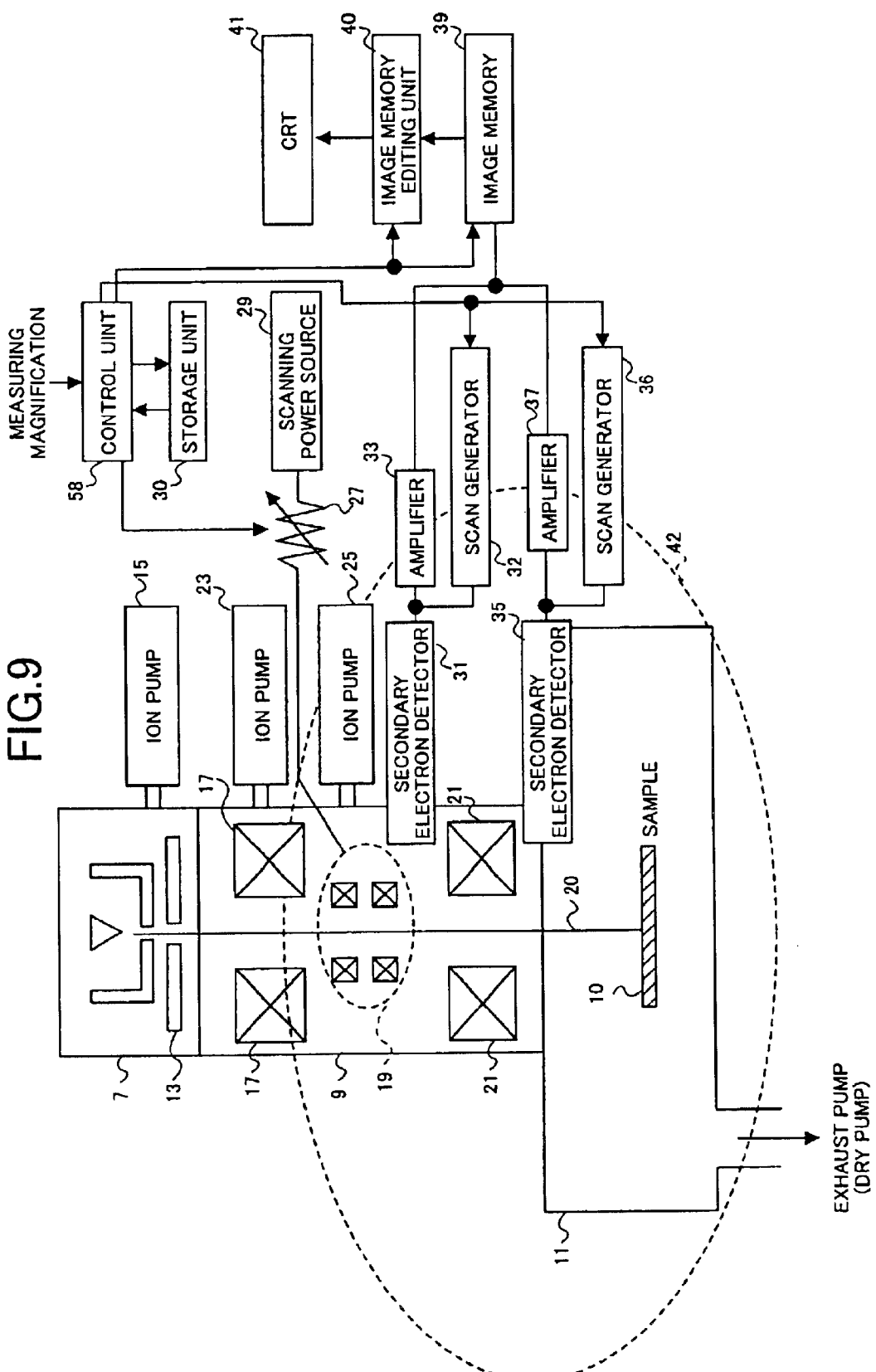
FIG. 9 shows the entire structure of a CD-SEM in accordance with a third embodiment of the present invention.

FIG. 9 shows the entire structure of a CD-SEM of a third embodiment of the present invention. As shown in FIG. 9, the CD-SEM of this embodiment has substantially the same structure as the CD-SEM of the second embodiment, except that a control unit 58 of this embodiment is further connected to the image memory 39.

Figure 10:
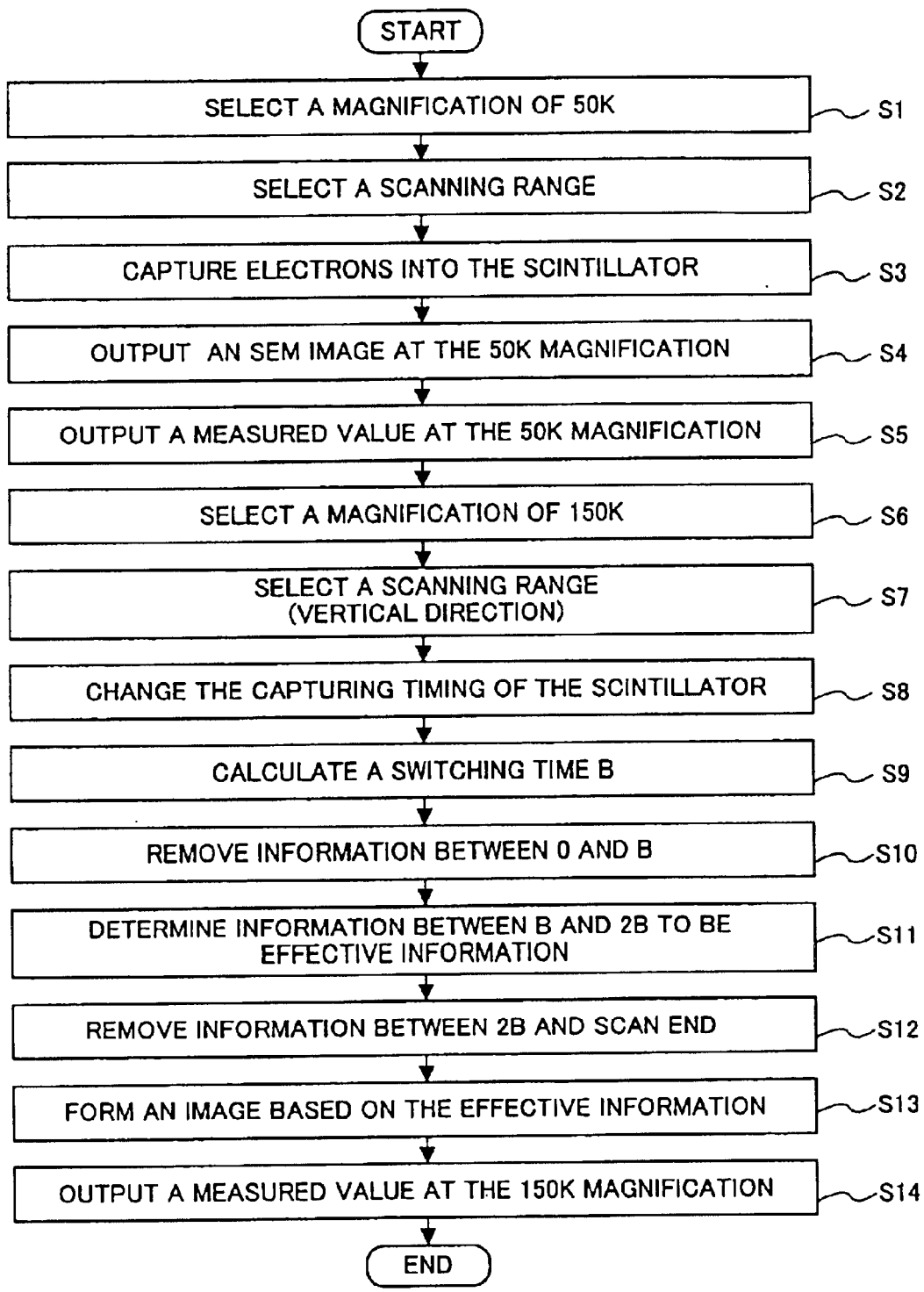
FIG. 10 is a flowchart showing an operation of the CD-SEM in accordance with the third embodiment of the present invention.

FIG. 10 is a flowchart showing an operation of the CD-SEM of the third embodiment of the present invention. As shown in FIG. 10, the CD-SEM of the third embodiment operates in the same manner as the CD-SEM of the second embodiment, except for the process of removing unnecessary information from the signal generated by the brightness conversion performed by the scintillator 44.

In the CD-SEM of the third embodiment, the image memory 39 is switched on and off by the control unit 58, so that the information supplied from the amplifiers 33 and 37 are selectively trimmed in advance. In the following, the operation of the CD-SEM of the third embodiment will be described, with reference to FIG. 10.

As shown in FIG. 10, a magnification of 50K, for instance, is selected as a measuring magnification in step S1. In step S2, a region that is specified by an initial setting is selected as an electron beam scanning range by the control unit 58. In step S3, the scanning range is irradiated with an electron beam, and the secondary electrons released from the sample to be measured are captured by the scintillator 44. In step S4, based on a signal generated by brightness conversion performed by the scintillator 44, an image obtained at the 50K magnification is outputted to the CRT 41. In step S5, a pattern-size measured value obtained at the 50K magnification is outputted to the CRT 41.

If desired information cannot be obtained from the image outputted to the CRT 41 in step S4, the magnification is further increased. In step S6, a magnification of 150K, for instance, is selected by the control unit 58. As the selected magnification of 150K is higher than the threshold magnification of 50K, a region that has the same length as the region at the 50K magnification in the horizontal direction, but has a smaller length than the region at the 50K magnification in the vertical direction is selected as the electron beam scanning range by the control unit 58. In order to change scanning ranges only in one direction (only in the vertical direction in this case), the ratio of currents flowing through the deflecting coils 19 in both directions should be varied, and the magnetic field of the electromagnetic lens should be balanced. The fixed axis in electron beam scanning may extend either in the vertical direction or in the horizontal direction.

In step S8, the timing of the scintillator capturing the secondary electrons released from the sample by irradiating the scanning range with an electron beam is changed by the control unit 58 in accordance with the equation (1). The changing of the timing is carried out by setting the capturing intervals of the scan generators 32 and 36 at the above intervals. The secondary electrons 22 captured by the scintillator 44 are then subjected to brightness conversion so as to generate signals depending on the brightness level. As the capturing intervals become shorter, the number of obtained signals become larger. Accordingly, when the information in accordance with the signals is outputted, a resultant image is too long in the horizontal direction.

In step S9, a switching time B is calculated by the control unit 58. The switching time B is obtained by the following equation (2), using a time S required for scanning being $1/16384$ (sec).

$$B=S/(FOV2/FOV1) \quad (2)$$

In the above equation (2), FOV2 is 3.0 μm, and FOV1 is 1.0 μm, for instance. In step S10, the image memory 39 is kept off between the scanning start and the switching time B, and the information obtained during this period is removed. The information obtained from the scanning start and the switching time B corresponds to a cut-off region shown in FIG. 6C.

In step S11, the image memory 39 is kept on during the period between the switching time B and a time 2B, and information obtained during this period is stored as effective information in the image memory 39. This effective information corresponds to an image information region 51 shown in FIG. 6C. In step S12, the image memory 39 is kept off by the control unit 58 during the period between the time 2B and the scanning end. Information obtained during this period is removed. The information obtained during the period between the time 2B and the scanning end corresponds to a cut-off region shown in FIG. 6C.

In step S13, an image obtained at the magnification of 150K is formed based on the effective information, and outputted to the CRT 41. In step S14, a pattern-size measured value obtained at the magnification of 150K is outputted to the CRT 41.

As described so far, with the CD-SEM in accordance with this embodiment, unnecessary information that is caused by a change of the capturing timing of the scintillator 44 is removed in the process of storing effective information in the image memory 39. Thus, image formation can be carried out at a higher speed.

Fourth Embodiment

Figure 11:
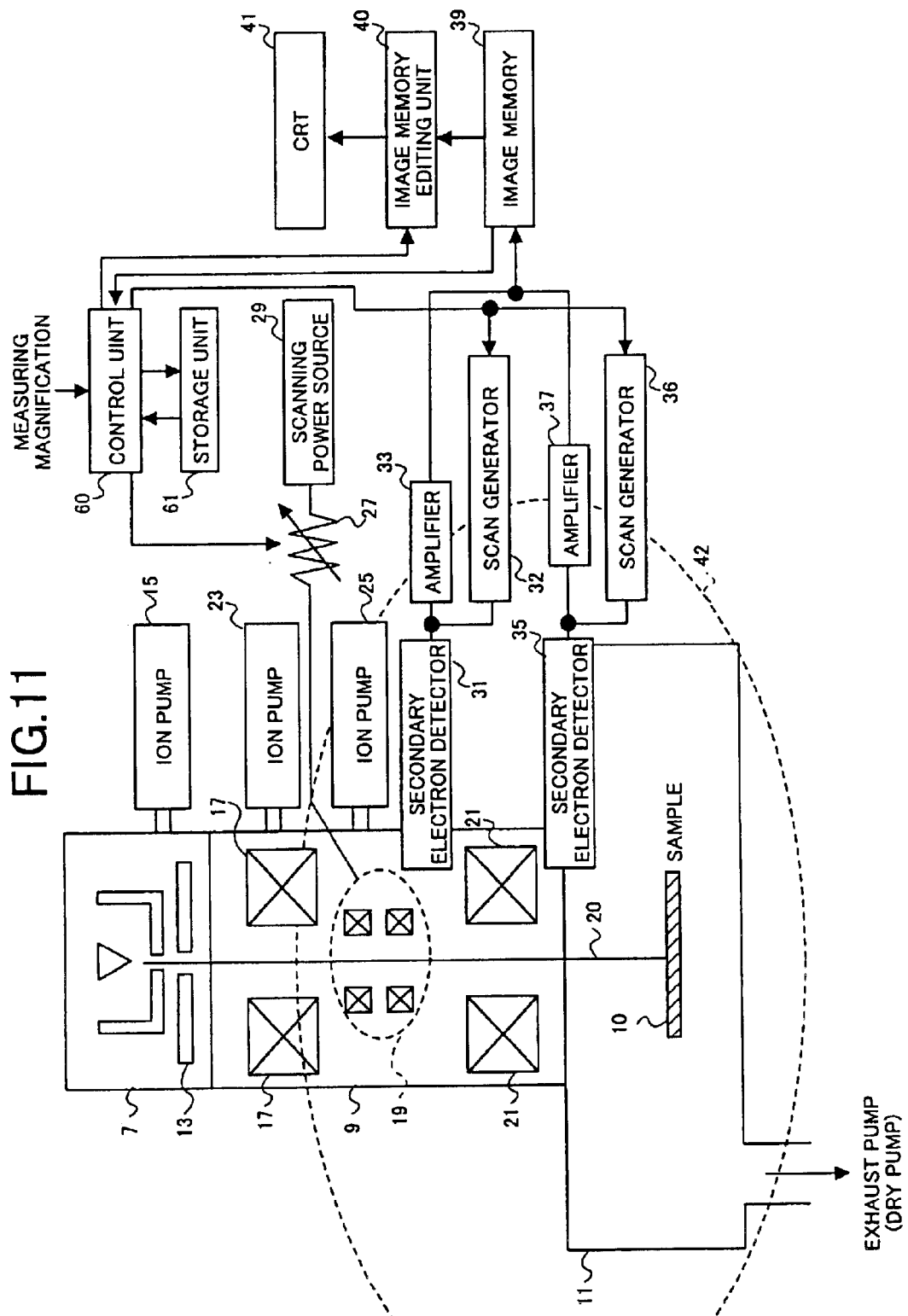
FIG. 11 shows the entire structure of a CD-SEM in accordance with a fourth embodiment of the present invention.

FIG. 11 shows the entire structure of a CD-SEM in accordance with a fourth embodiment of the present invention. As shown in FIG. 11, the CD-SEM of this embodiment has substantially the same structure of the CD-SEM of the third embodiment, except for the structure of a control unit 60 and data stored in a storage unit 61.

Figure 12:
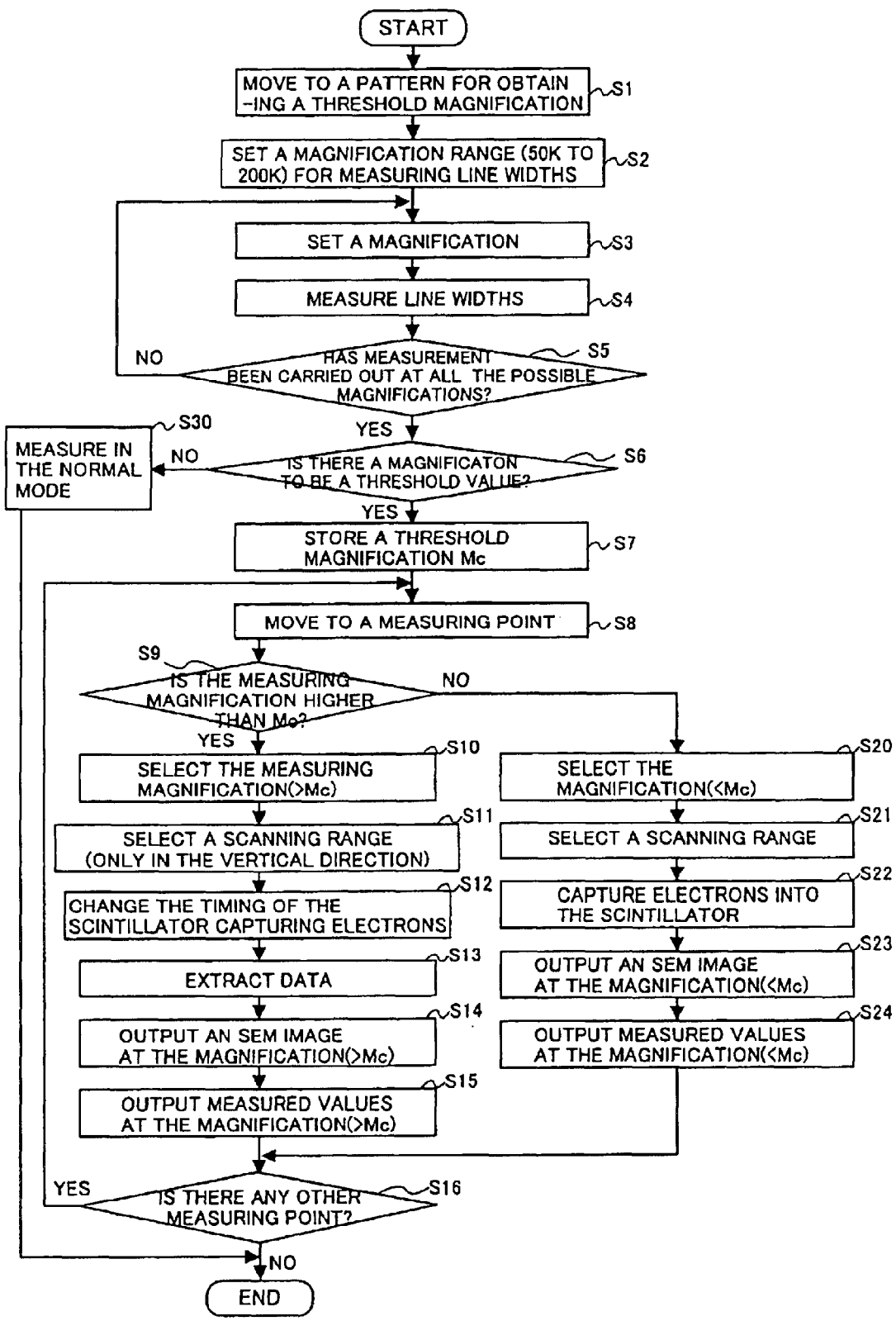
FIG. 12 is a flowchart of an operation of the CD-SEM in accordance with the fourth embodiment of the present invention.
Figure 13:
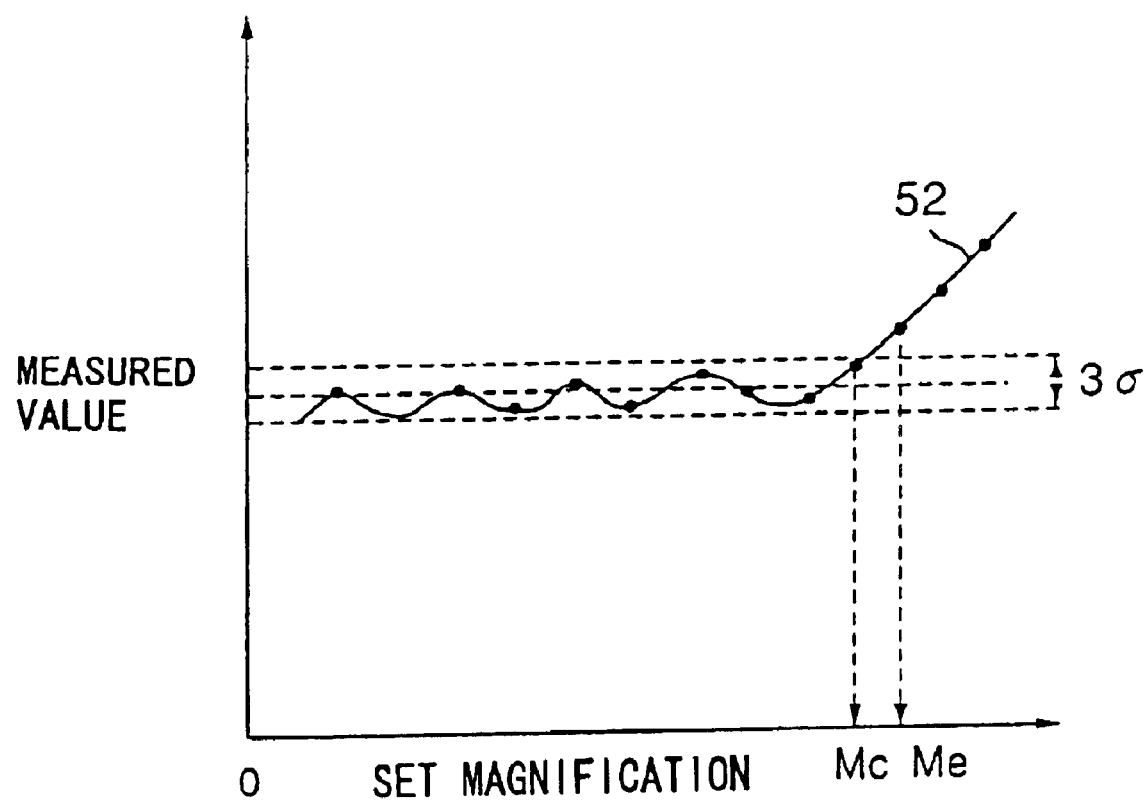
FIG. 13 is a graph showing the operation of the CD-SEM in accordance with the fourth embodiment of the present invention.

FIG. 12 is a flowchart showing an operation of the CD-SEM in accordance with the fourth embodiment of the present invention. FIG. 13 is a graph illustrating the operation of the CD-SEM in accordance with the fourth embodiment. The CD-SEM of this embodiment operates in the same manner as the CD-SEM of the third embodiment, except that the CD-SEM of this embodiment is capable of calculating the threshold magnification by itself. In the following, the operation of the CD-SEM of this embodiment will be described in greater detail, with reference to FIG. 12.

As shown in FIG. 12, in step S1, a beam spot of the primary electrons 20 is moved to a line pattern (a test pattern) formed on the surface of a sample for determining a threshold magnification. In step S2, a magnification range for measuring the line widths of the line pattern is determined to be between 50K and 200K, for instance. In step S3, the highest possible magnification for measuring line widths is set as the initial magnification by the control unit 60. In step S4, the line widths are measured at magnifications in the magnification range, and measured values are supplied from the image memory 39 and stored into the storage unit 61 via the control unit 60.

In step S5, it is determined whether or not a measurement has been carried out at all the possible magnifications in the magnification range. If it is determined not, the operation returns to step S3, where the initial magnification is reset to a magnification one step lower than the previously set initial magnification. The magnifications are sequentially set so as to decrease monotonically. In step S4, the same line widths as measured once before are again measured at magnifications starting from the newly set initial magnification. The line pattern may be a pitch pattern formed in a scribe region or dummy region of a device chip. More specifically, the line pattern may be a pitch pattern made up of five or more lines. This pitch pattern is effective in equalizing the measurement conditions. However, the line pattern may also be a space pattern or a contact hole pattern.

When the measurement is completed at the lowest possible magnification for measuring line widths, the operation advances to step S6. The relationship between the magnifications and the measured values can be represented by a measurement value curve 52 shown in FIG. 13, for instance. From the measured value curve 52, an error distribution of the measure values can be calculated. As shown in FIG. 13, when the error of the measured values exceeds the reproduction precision guaranteed range of the CD-SEM, $3\sigma=2$ nm, for instance, the control unit 60 determines that there is a magnification that should be a threshold value. In step S7, the control unit 60 determines that a magnification Mc is the threshold magnification, and the magnification Mc is stored as the threshold magnification in the storage unit 61. Here, the magnification Mc is one step lower than a magnification Me that is beyond the reproduction precision guaranteed range. On the other hand, if the control unit 60 determines in step S6 that the error of the measured values does not exceed the reproduction precision guaranteed range, $3\sigma=2$ nm, for instance, and that there is no magnification to be a threshold value, the operation moves on to step S30.

In step S30, the control unit 60 sets a normal mode in which the magnification is 50K and the electron capturing timing by the scintillator 44 is the initial value, and measurement is carried out in the normal mode.

In step S8, the beam spot formed by the primary electrons 20 is moved to a measuring point to be measured. In step S9, the control unit 60 determines whether or not a measuring magnification is higher than the threshold magnification Mc stored in the storage unit 61, and if the measuring magnification is higher than the threshold value Mc, the operation moves on to step S10. In step S10, the measuring magnification is selected. In step S11, a region that is reduced only in the vertical direction is selected as an electron beam scanning range. To change the scanning range only in one direction (the vertical direction in this case), the ratio of currents to flow through the deflecting coils 19 corresponding to the respective directions is varied, and the magnetic field of the electromagnetic lens is balanced. The fixed axis in the electron beam scanning extends either in the vertical direction or in the horizontal direction.

In step S12, the timing of the scintillator 44 capturing secondary electrons released from the sample due to the irradiation is changed. In other words, the capturing intervals T of the scintillator can be determined by the equation (1). The change of the timing is carried out by the control unit 60, which sets the capturing intervals of the scan generators 32 and 36 at the above timing. The secondary electrons 22 captured by the scintillator 44 are then subjected to brightness conversion to generate signals depending on the brightness level.

As the capturing intervals become shorter, the number of signals obtained becomes larger. Accordingly, when the information obtained by the signals is outputted, the resultant image is too long in the horizontal direction. Therefore, in step S13, unnecessary information is cut off by the image memory editing unit 40 controlled by the control unit 60, and the remaining data is extracted. In step S14, an image obtained at the set measuring magnification is outputted onto the CRT 41. In step S15, the line widths (the measured values) measured at the measuring magnification are outputted to the CRT 41.

Meanwhile, if the control unit 60 determines that the set measuring magnification is lower than the threshold magnification, the operation moves on to step S20. In step S20, a measuring magnification lower than the threshold magnification Mc is selected. In step S21, the control unit 60 selects the region initially determined to be the electron beam scanning range. In step S22, the scanning range is irradiated with an electron beam, and the secondary electrons released from the sample are captured by the scintillator 44.

In step S23, based on the signals generated by the brightness conversion, an image at the measuring magnification obtained by the CD-SEM is outputted onto the CRT 41. In step S24, the measured values obtained as a result of the measurement by the CD-SEM at the measuring magnification are outputted. In step S16, the control unit 60 determines whether or not there is any other measuring point. If there is, the operation returns to step S8. If there is no other measuring points, the operation comes to an end.

As described so far, with the CD-SEM of the fourth embodiment, the optimum measurement control can be readily achieved, because the threshold magnification Mc used for changing the scanning range or electron capturing timing can be automatically calculated based on the measurement results of a line pattern formed on the surface of a sample for determining the threshold magnification Mc.

Fifth Embodiment

A CD-SEM of a fifth embodiment of the present invention is substantially the same as the CD-SEM of the fourth embodiment, except that the threshold magnification Mc is self-calculated.

More specifically, in the CD-SEM of the foregoing fourth embodiment of the present invention, the threshold magnification is determined by the control unit 60 based on measurement results at various magnifications of 50K to 200K. In the CD-SEM of this embodiment, however, a measured value at a first magnification is compared with a measured value at a second magnification that is smaller than the first magnification. If the difference between the two measured values exceeds a measurement reproduction accuracy of the CD-SEM (3σ=2 nm, for instance), the control unit selects the second magnification as the threshold magnification Mc and stores the selected threshold magnification in the storage unit.

Figure 14:
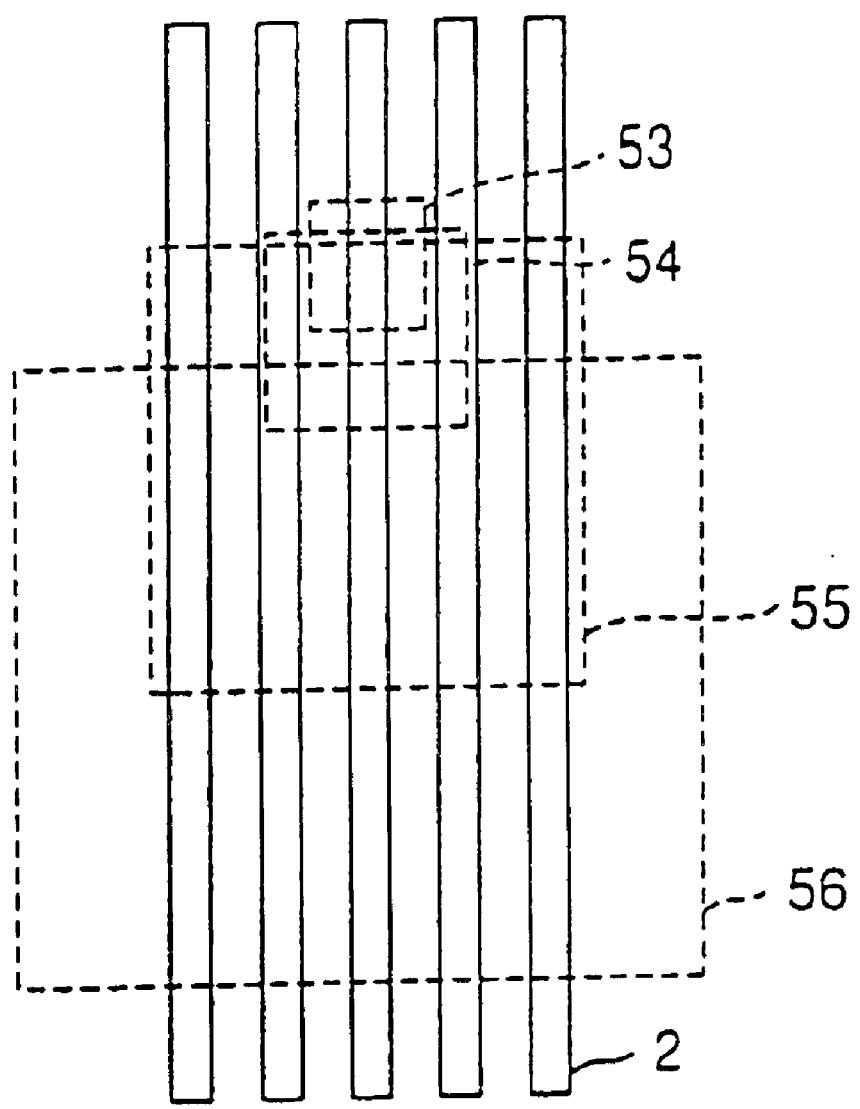
FIG. 14 illustrates an operation of a CD-SEM in accordance with a fifth embodiment of the present invention.

As shown in FIG. 14, the control unit selects a region 53 as the electron beam scanning range at a set magnification of 200K, a region 54 at a magnification of 150K, a region 55 at a magnification of 100K, and a region 56 at a magnification of 75K. In this manner, the electron beam scanning range is varied depending on the magnification, thereby reducing damage on the sample. Thus, the measuring accuracy can be increased.

Sixth Embodiment

A CD-SEM of a sixth embodiment is substantially the same as the CD-SEM of the fourth embodiment in terms of the structure as well as the operation. However, the CD-SEM of the sixth embodiment differs from the CD-SEM of the fourth embodiment in that it is capable of calculating the threshold magnification Mc.

More specifically, in the CD-SEM of the fourth embodiment, magnifications are sequentially set in a range for measuring the line widths of a line pattern, for instance, a range of 50K to 200K, so that they monotonically decrease. In the CD-SEM of this embodiment, on the other hand, magnifications are sequentially set so that they monotonically increase from the lowest possible magnification for measuring the line widths of a line pattern to the highest possible magnification for measuring the line widths.

By the different set magnifications and measured value obtained with the set magnifications, the measured value curve shown in FIG. 13 is obtained.

With the CD-SEM of the sixth embodiment, the same effects as with the CD-SEM of the fourth embodiment can be achieved.

The present invention is not limited to the specifically disclosed embodiments, but variations and modifications may be made without departing from the scope of the present invention.

The present application is based on Japanese priority application No. 2000-085325, filed on Mar. 24, 2000, the entire contents of which are hereby incorporated by reference.

What is claimed is:

1. A method of controlling a scanning electron microscope, the method comprising the steps of:
   irradiating a surface of an object with a primary electron beam swept, in a scanning direction, over a fixed scanning range length; and
   detecting secondary electrons released from the object due to the irradiation during a predetermined period constituting a portion of a fixed primary electron beam scanning time, the primary electron beam scanning time comprising a single sweep of the primary electron beam in the scanning direction over the fixed scanning range length,
   wherein the predetermined period is changed depending on a magnification for observing the object, without changing a scanning rate of the primary electron beam across the surface of the object.

2. The method as claimed in claim 1,
   wherein the step of detecting secondary electrons further comprises extracting image data obtained during the predetermined period, and wherein the portion of the electron beam scanning time is proportional to the predetermined period; and
   wherein the method further comprises a step of displaying an image at the magnification for observing the object, in accordance with the extracted image data.

3. The method as claimed in claim 1, further comprising the steps of:
   storing only data obtained during the predetermined period of time corresponding to the magnification from all data obtained as a result of the detection; and
   displaying an image at the magnification for observing the object in accordance with the stored data.

4. The method as claimed in claim 1, wherein the predetermined period is shorter when the magnification is higher.

5. The method as claimed in claim 1, wherein, when the magnification is higher than a threshold magnification that is stored in the scanning electron microscope in advance, electrons are detected during the predetermined period in accordance with the magnification.

6. The method as claimed in claim 5, wherein the threshold magnification is determined in accordance with an error distribution of measured values obtained by measuring a test pattern at different magnifications.

7. The method as claimed in claim 6, wherein measured values of the test pattern are sequentially set so that the magnification monotonically increases or decreases.

8. The method as claimed in claim 5, wherein a second magnification is selected as the threshold magnification when a difference between a first measured value obtained at a first magnification and a second measured value obtained at the second magnification smaller than the first magnification exceeds a predetermined value.

9. A method of controlling a scanning electron microscope, the method comprising the steps of:
   irradiating a surface of a sample object with a primary electron beam; and
   detecting secondary electrons released from the surface of the sample object due to the irradiation,
   wherein:
   a first scanning range in a first direction of two different directions on the surface of the sample object is selected in accordance with a detection magnification on the surface of the sample object, while a second scanning range in a second direction of the two different directions is fixed; and
   the secondary electron detection is performed at intervals T=(FOY1/FOV2)×t1, with a first portion of the second scanning range being FOV1, the entire second scanning range being FOV2, and an initial value of the intervals being t1.

10. The method as claimed in claim 9, wherein, among all data obtained as a result of the detection, data corresponding to a ratio of FOV1/FOV2 is extracted as image date, and an image at the detection magnification on the surface of the sample object is displayed based on the image data.

11. The method as claimed in claim 9, wherein:
    a switching time B is determined by S/(FOV1/FOV2), with a primary electron beam scanning time S;
    only data obtained by detecting secondary electrons during a period between the switching time B after a scanning start and a time 2B are stored; and
    an image is displayed at a magnification on the surface of the sample object in accordance with the data.

12. A scanning electron microscope, comprising:
    an irradiating unit that irradiates an object with a primary electron beam swept, in a scanning direction, over a fixed scanning range length; and
    a detecting unit that detects secondary electrons released from the object due to the irradiation during a predetermined period constituting a portion of a fixed primary electron beam scanning time, the primary electron beam scanning time comprising a single sweep of the primary electron beam in the scanning direction over the fixed scanning range length,
    wherein the predetermined period is changed depending on a magnification at which the object is observed, without changing a scanning rate of the primary electron beam across the surface of the object.

13. The scanning electron microscope as claimed in claim 12, further comprising:
    a data extracting unit that extracts image data by an inverse number rate of the magnification from all data obtained as a result of secondary election detection; and
    a display unit that displays an image at the magnification for observing the object in accordance with the extracted image data.

14. The scanning electron microscope as claimed in claim 12, further comprising:
    a data storing unit that stores only data obtained during the predetermined period of time corresponding to the magnification, from all data obtained as a result of the detection; and
    a display unit that displays an image at the magnification for observing the object, in accordance with the stored data.

15. The scanning electron microscope as claimed in claim 12, wherein the predetermined period is shorter when the magnification is higher.

16. The scanning electron microscope as claimed in claim 15, further comprising a storage unit that stores a threshold magnification in advance,
    wherein the detecting unit detects electrons during the predetermined period depending on a magnification that is higher than the threshold magnification stored in the storage unit.

17. The scanning electron microscope as claimed in claim 16, further comprising a threshold magnification determining unit that calculates an error distribution of measured values obtained by measuring a test pattern at different magnifications, and determines the threshold magnification depending on the error distribution.

18. The scanning electron microscope as claimed in claim 17, wherein the threshold magnification determining unit sequentially sets the magnification when the test pattern is measured, so that the magnification monotonically increases and decreases.

19. The scanning electron microscope as claimed in claim 16, wherein, when a difference between a first measured value obtained at a first magnification and a second measured value obtained at a second magnification exceeds a predetermined value, the second magnification is stored as the threshold magnification in the storage unit.

20. A scanning electron microscope that irradiates a surface of a sample object with a primary electron beam so as to detect secondary electrons released from the surface of the sample object due to the irradiation, said microscope comprising:
    a scanning unit that determines a first scanning range in a first direction of two different directions on the surface of the sample object in accordance with a detection magnification for the surface of the sample object, while maintaining a second scanning range in a second direction of the two different directions constant; and
    a detection timing determining unit that determines intervals T for detecting secondary electrons by (FOV1/FOV2)×t1, a first portion of the second scanning range being FOV1, the entire second scanning range being FOV2, and an initial value of detection intervals being t1.

21. The scanning electron microscope as claimed in claim 20, further comprising:
    a data extracting unit that extracts data corresponding to a ratio of FOV1/FOV2 as image data from all data obtained as a result of secondary election detection; and
    a display unit that displays an image based on the image data at the detection magnification for the surface of the sample object.

22. The scanning electron microscope as claimed in claim 20, further comprising:
    a switching time calculating unit that determines a switching time B by S/(FOV2/FOV1), with an electron beam scanning time being S;
    a data storage unit that stores data obtained by detecting electrons only during a period between the switching time B after a scanning start and a time 2B; and
    a display unit that displays an image at the magnification for the surface of the sample object based on the data stored in the data storage unit.

23. A method of controlling a scanning microscope, comprising the steps of:

irradiating an object with a primary electron beam focused on a surface of the object, the electron beam having an electron current density corresponding to a first magnification factor on a surface of the object;

detecting secondary electrons emitted from the object in response to an irradiation of the object with the electron beam;

acquiring a two-dimensional image of the object with the first magnification factor, by sampling the secondary electrons during a predetermined first period constituting a portion of a primary electron beam scanning time, corresponding to the first magnification factor;

selecting a region in the two-dimensional image;

scanning the selected region with the electron beam, the electron beam having the electron current density on the surface of the object;

detecting the secondary electrons emitted from the region in response to an irradiation of the region with the electron beam;

acquiring a two-dimensional image of the region with a second, larger magnification factor, by sampling the electron beam during a predetermined second period constituting a portion of an electron beam scanning time, corresponding to the second magnification factor, the second period being smaller than the first period, wherein the predetermined first period and the predetermined second period are changed without changing a scanning rate of the electron beam.

24. The method as claimed in claim 23, further comprising the steps of:

selecting a sub-region in the two-dimensional image of the region; and producing a two-dimensional image of the sub-region, by eliminating data of the two-dimensional image of the region outside the sub-region.

25. The method as claimed in claim 23, further comprising the step of measuring a pattern size based on the two-dimensional image of the sub-region.

* * * * *